(12) United States Patent
Oomori

(10) Patent No.: US 8,097,962 B2
(45) Date of Patent: Jan. 17, 2012

(54) SEMICONDUCTOR DEVICE

(75) Inventor: Kouji Oomori, Shiga (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/372,130

(22) Filed: Feb. 17, 2009

(65) Prior Publication Data

US 2009/0278255 A1    Nov. 12, 2009

(30) Foreign Application Priority Data

May 9, 2008  (JP) .................. 2008-123505
Jan. 16, 2009  (JP) .................. 2009-008178

(51) Int. Cl.
  *H01L 23/48*  (2006.01)
  *H01L 23/52*  (2006.01)
  *H01L 29/40*  (2006.01)

(52) U.S. Cl. ............ 257/786; 257/686; 257/E23.015; 257/E23.142; 438/108

(58) Field of Classification Search ........... 257/E23.169, 257/786
See application file for complete search history.

(56) References Cited

U.S. PATENT DOCUMENTS

| | | | | |
|---|---|---|---|---|
| 5,581,122 A * | 12/1996 | Chao et al. | ............ | 257/691 |
| 5,767,447 A * | 6/1998 | Dudderar et al. | ............ | 174/546 |
| 6,054,337 A * | 4/2000 | Solberg | ............ | 438/107 |
| 6,242,815 B1 * | 6/2001 | Hsu et al. | ............ | 257/786 |
| 6,451,689 B1 | 9/2002 | Kumamoto | | |
| 6,476,331 B1 * | 11/2002 | Kim et al. | ............ | 174/261 |
| 6,586,683 B2 * | 7/2003 | Arrington et al. | ............ | 174/255 |
| 6,890,849 B2 | 5/2005 | Kado et al. | | |
| 2003/0006489 A1 * | 1/2003 | Fujii et al. | ............ | 257/668 |
| 2003/0022477 A1 | 1/2003 | Hsieh et al. | | |
| 2003/0116349 A1 * | 6/2003 | Hashimoto | ............ | 174/260 |
| 2003/0194485 A1 * | 10/2003 | Rhee et al. | ............ | 427/98 |
| 2005/0224976 A1 | 10/2005 | Hsu et al. | | |
| 2007/0059918 A1 * | 3/2007 | Jung et al. | ............ | 438/618 |
| 2008/0257742 A1 * | 10/2008 | Lee et al. | ............ | 205/126 |

FOREIGN PATENT DOCUMENTS

JP    2005-256128    9/2005

* cited by examiner

*Primary Examiner* — Ha Tran T Nguyen
*Assistant Examiner* — Shaka Scarlett
(74) *Attorney, Agent, or Firm* — McDermott Will & Emery LLP

(57) ABSTRACT

A semiconductor device includes a substrate having external connection terminals, and a semiconductor chip mounted over a semiconductor-chip mounting portion of the substrate. The external connection terminals are formed by sequentially forming an electroless nickel plating layer, an electroless gold plating layer, and an electrolytic gold plating layer on a terminal portion formed on a surface of the substrate.

20 Claims, 3 Drawing Sheets

SEMICONDUCTOR DEVICE

CROSS-REFERENCE TO RELATED APPLICATIONS

This application claims priority under 35 U.S.C. §119(a) on Japanese Patent Application No. 2008-123505 filed on May 9, 2008 and Japanese Patent Application No. 2009-8178 filed on Jan. 16, 2009, the entire contents of which are hereby incorporated by reference.

BACKGROUND OF THE INVENTION

The present invention relates to a semiconductor device.

Semiconductor devices generally include a substrate having external connection terminals, a semiconductor chip provided over the substrate, and connection bumps connected to the external connection terminals.

The external connection terminals are formed by sequentially forming a first electroless plating layer, a second electroless plating layer, and a third electroless plating layer on a terminal portion formed on a surface of the substrate (see, for example, Japanese Patent Laid-Open Publication No. 2005-256128).

SUMMARY OF THE INVENTION

As well known in the industry, the reason why the external connection terminals are formed by sequentially forming a first electroless plating layer, a second electroless plating layer, and a third electroless plating layer on the terminal portion formed on the substrate surface is as follows: the external connection terminals are formed in this manner in order to improve connection reliability when the external connection terminals are connected to another substrate through connection bumps after formation of the external connection terminals. More specifically, the external connection terminals are formed in this manner in order to firmly connect the terminal portion with the connection bumps (made of solder), in order to prevent so-called "solder eating" of the connection bumps (a phenomenon in which a metal is dissolved by molten solder), and the like in the case where the terminal portion as the lowermost layer is made of a copper layer.

However, in the case where the external connection terminals are formed by sequentially forming the first electroless plating layer, the second electroless plating layer, and the third electroless plating layer on the terminal portion formed on the substrate surface, bondability between the connection bumps and the external connection terminals may be degraded by moisture. More specifically, the surface condition of the electroless plating layer is not dense when the electroless plating layer is viewed on an enlarged scale. Moisture is therefore likely to enter through the surface (the third electroless plating layer). If moisture enters through the third electroless plating layer, metal atoms of a layer (the first or second electroless plating layer) located lower than the third electroless plating layer are exposed at the surface of the third electroless plating layer due to the moisture. As a result, the surface condition of the external connection terminals changes, thereby degrading the bondability between the connection bumps and the external connection terminals.

A semiconductor device according to the present invention includes a substrate having external connection terminals, and a semiconductor chip provided over the substrate. The external connection terminals have a terminal portion formed on a surface of the substrate, an electroless plating layer formed on the terminal portion, and an electroplating layer formed on the electroless plating layer. Since the surface layer of the external connection terminals is made of the electroplating layer, moisture can be prevented from entering through the surface (the electroplating layer).

DETAILED DESCRIPTION OF THE PREFERRED EMBODIMENTS

Hereinafter, an embodiment of the present invention will be described in detail with reference to the accompanying drawings. Note that the present invention is not limited to the embodiment described below.

Figure 1:
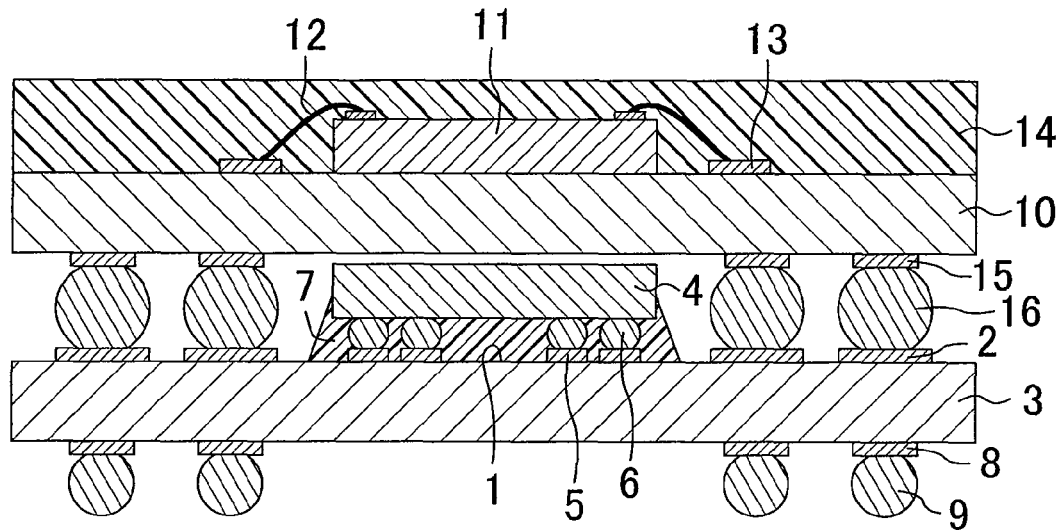
FIG. 1 is a cross-sectional view of a semiconductor device according to an embodiment of the present invention.
Figure 2:
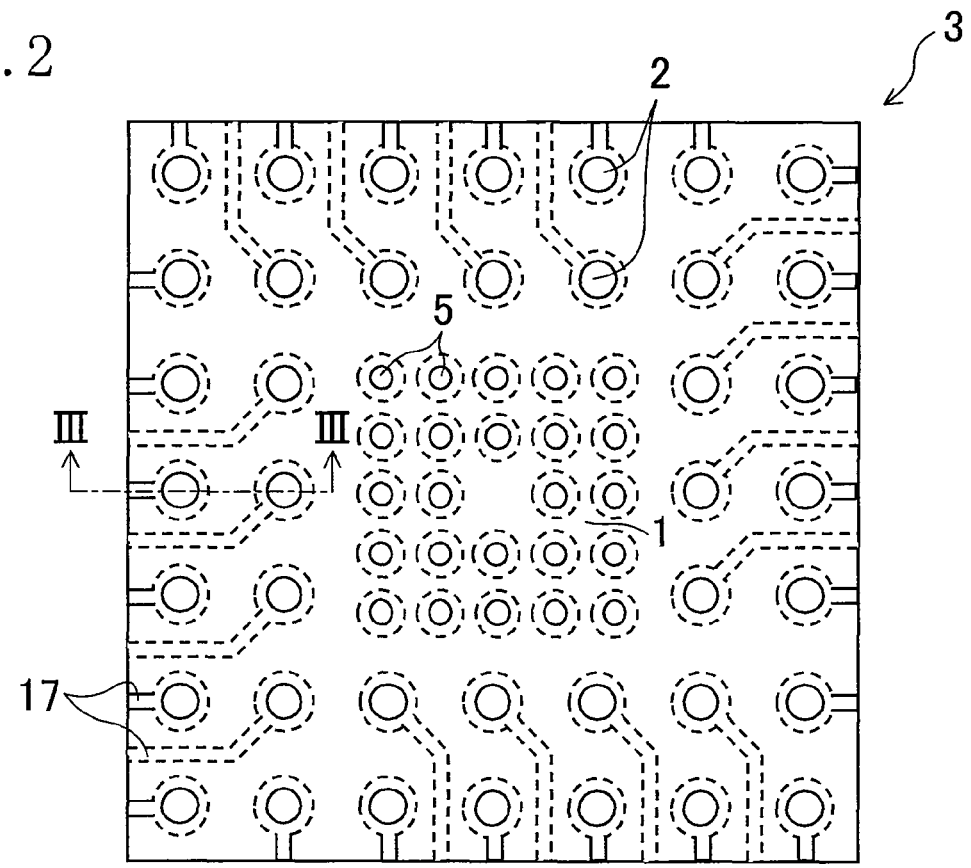
FIG. 2 is a top view of a substrate 3 in the embodiment of the present invention.
Figure 3:
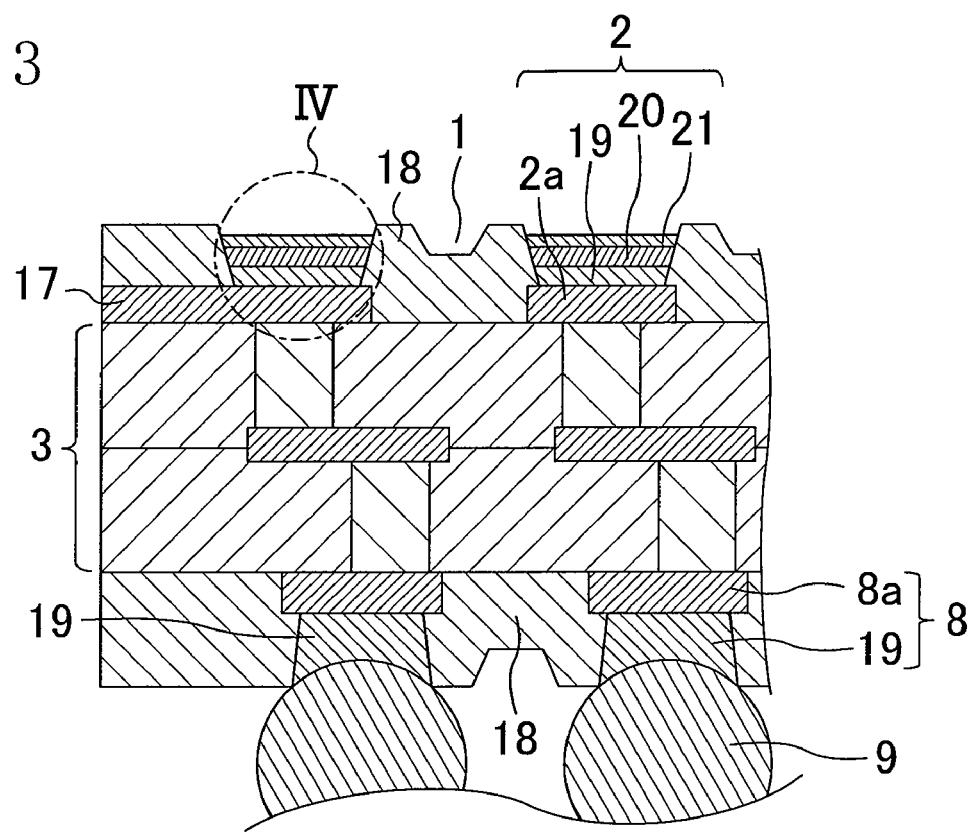
FIG. 3 is a cross-sectional view taken along line III-III in FIG. 2.
Figure 4:
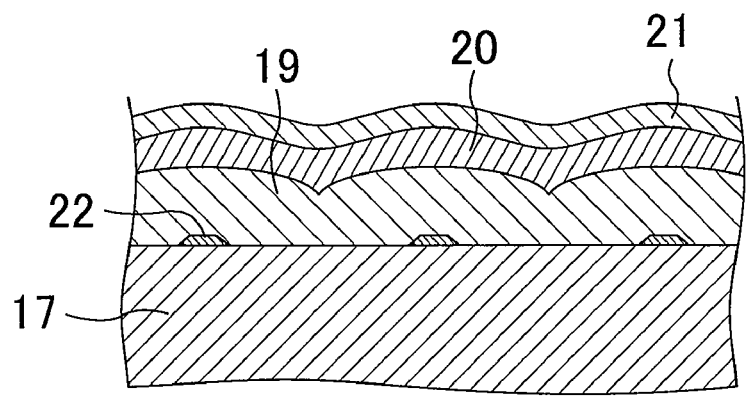
FIG. 4 is an enlarged cross-sectional view in a region IV shown in FIG. 3.

FIG. 1 is a cross-sectional view of a semiconductor device according to the present embodiment. FIG. 2 is a top view of a substrate. FIG. 3 is a cross-sectional view taken along line III-III in FIG. 2. FIG. 4 is an enlarged view of a region IV shown in FIG. 3.

Figure 5:
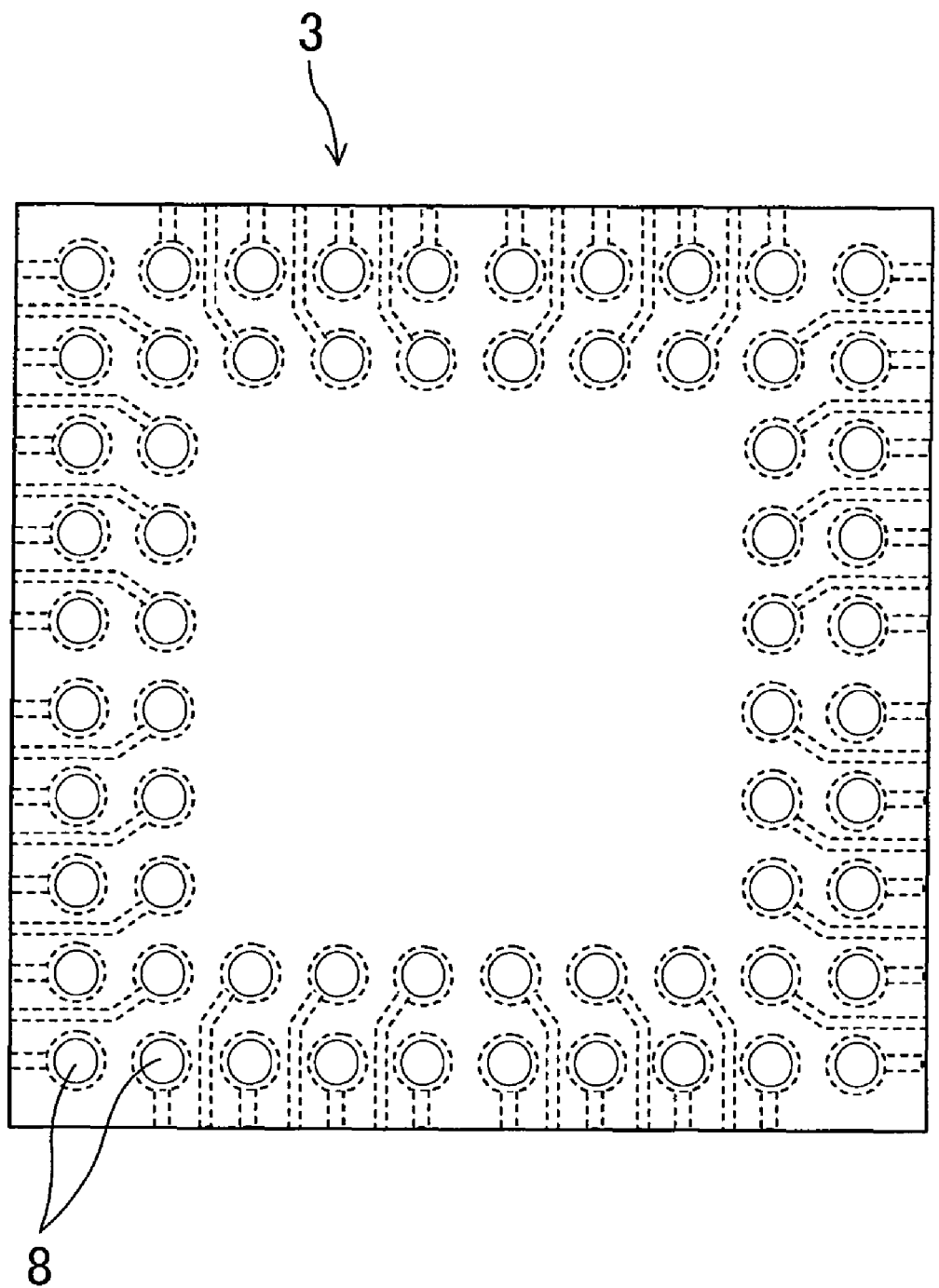
FIG. 5 is a bottom view of the substrate 3 in the embodiment of the present invention.

FIG. 5 is a bottom view of the substrate.

As shown in FIGS. 1 and 2, the semiconductor device of the present embodiment includes a substrate 3 and a semiconductor chip 4. The substrate 3 has a semiconductor-chip mounting portion 1 and external connection terminals 2 on its top surface. The semiconductor chip 4 is mounted over the semiconductor-chip mounting portion 1 of the substrate 3.

Connection terminals 5 are provided on the top surface of the substrate 3, and the semiconductor chip 4 is electrically connected to the connection terminals 5 though connection bumps 6. This state (the state in which the semiconductor chip 4 is electrically connected to the connection terminals 5 through the connection bumps 6) is fixed by an adhesive 7. External connection terminals 8 and connection bumps 9 are provided on the bottom surface of the substrate 3.

The substrate 3 is structured as described above. As shown in FIG. 1, another substrate (substrate 10) is provided over the substrate 3. The structure of the substrate 10 will now be described.

A semiconductor chip 11 and connection terminals 13 are provided on the top surface of the substrate 10. The semiconductor chip 11 and the connection terminals 13 are electrically connected to each other through thin metal wires 12. The semiconductor chip 11, the thin metal wires 12, and the connection terminals 13 are sealed by a sealing resin 14.

This substrate 10 is connected to the substrate 3 by the following method: connection bumps 16 are provided between the external connection terminals 2 on the top surface of the substrate 3 and external connection terminals 15 on the bottom surface of the substrate 10 so that the external connection terminals 2 are electrically and structurally connected to the external connection terminals 15 through the connection bumps 16.

In the present embodiment, the semiconductor device having the substrate 10 over the substrate 3 is structured as described below so that the surface condition of the external connection terminals 2 provided on the top surface of the substrate 3 does not change before the process of bonding the substrate 3 and the substrate 10 together is performed.

As shown in FIG. 2, a plurality of connection terminals 5 are formed as the semiconductor-chip mounting portion 1 in an inner region (central region) of the top surface (front surface) of the substrate 3. A plurality of external connection terminals 2 are formed outside (on the peripheral side of) the semiconductor-chip mounting portion 1 on the top surface of the substrate 3. In other words, the plurality of external connection terminals 2 are formed in the peripheral edge portion of the top surface of the substrate 3. Electroplating wiring patterns 17 are formed so as to extend from the external connection terminals 2 to the outer periphery of the substrate 3. The electroplating wiring patterns 17 are made of a copper film.

As shown in FIG. 3, the top surface of each electroplating wiring pattern 17 is covered with a solder resist 18. The solder resist 18 is removed in each region where the external connection terminal 2 is formed, and a terminal portion 2a of the external connection terminal 2 is formed in this region. More specifically, in each region where the solder resist 18 has been removed, an electroless nickel plating layer 19 as a first electroless plating layer, an electroless gold plating layer 20 as a second electroless plating layer, and an electrolytic gold plating layer 21 as an electroplating layer are sequentially formed on the terminal portion 2a of the electroplating wiring pattern (copper layer) 17.

Electric power for forming the electrolytic gold plating layer 21 is supplied through the electroplating wiring patterns 17 extending to the outer periphery of the substrate 3, with the substrate 3 immersed in an electroplating bath.

FIG. 2 shows a state in which the electroplating wiring patterns 17 are separated in the outer periphery of the substrate 3. In the electroplating process, however, a substrate formed by a plurality of substrates 3 (one of them is shown in FIG. 2) integrally connected together in a plane is used, and the electroplating wiring patterns 17 are electrically connected to each other in this substrate.

After the electrolytic gold plating layer 21 is formed by supplying electric power, the substrate is divided into individual substrates 3 as shown in FIG. 2.

FIG. 4 is an enlarged view of one external connection terminal 2 formed as described above. Pd (palladium) plating seeds 22 are present on the electroplating wiring pattern 17. The electroless nickel plating layer 19 is formed by using the Pd plating seeds 22 as plating nuclei. The electroless gold plating layer 20 and the electrolytic gold plating layer 21 are formed over the electroless nickel plating layer 19.

Since the electrolytic gold plating layer 21 is formed by electroplating, the electrolytic plating layer 21 has a dense surface. Accordingly, moisture or the like does not enter through the surface of the electrolytic gold plating layer 21 and, as a matter of course the surface of the electrolytic gold plating layer 21 does not change.

In other words, in the present embodiment, the semiconductor device having the substrate 10 over the substrate 3 as described above includes the electrolytic gold plating layer 21 so that the surface condition of the external connection terminals 2 provided on the top surface of the substrate 3 does not change before the substrate 3 and the substrate 10 are bonded together. Since the surface layer portion of the external connection terminals 2 is made of the electrolytic gold plating layer 21, the connection bumps 16 can be firmly fixed to the electrolytic gold plating layer 21. As a result, bondability between the connection bumps 16 and the external connection terminals 21 can be improved.

In order to form the electrolytic gold plating layer 21, the electroplating wiring patterns 17 made of a copper film are formed so as to extend from the external connection terminals 2 to the outer periphery of the substrate 3.

The electroplating wiring patterns 17 are thus left on the completed substrate 3. The electroplating wiring patterns 17 can therefore suppress peeling off of the external connection terminals 2. More specifically, even if, for example, the substrates 3 and the substrate 10 in FIG. 1 have different thermal expansion coefficients from each other and a force that tries to peel off the external connection terminals 2 through the connection bumps 16 is applied due to the difference in thermal expansion coefficient between the substrates 3 and 10, the electroplating wiring patterns 17 remaining on the substrate 3 will serve as, for example, a root. The electroplating wiring patterns 17 can thus suppress peeling off of the external connection terminals 2.

Note that, in the external connection terminals 8, an electroless nickel plating layer 19 is formed on a terminal portion 8a as shown in FIG. 3, and the connection bumps 9 made of solder balls are provided on the external connection terminals 8. It is herein assumed that, like the external connection terminals 2, the external connection terminals 8 are formed by sequentially forming an electroless nickel plating layer 19, an electroless gold plating layer 20, and an electrolytic gold plating layer 21 on the terminal portion 8a. In this case, if solder balls are provided as the connection bumps 9 on the electrolytic gold plating layer 21, gold plating of the electroless gold plating layer 20 and the electrolytic gold plating layer 21 diffuses into the connection bumps 9. Accordingly, in the external connection terminals 8, the electroless nickel plating layer 19 is formed on the terminal portion 8a as shown in FIG. 3.

As shown in FIG. 5, the external connection terminals 8 are provided on the peripheral edge portion of the bottom surface of the substrate 3. Like the top surface of the substrate 3 (FIG. 2), electroplating wiring patterns 17 made of a copper film may be formed on the bottom surface of the substrate 3 so as to extend from the external connection terminals 8 to the outer periphery of the substrate 3.

The connection terminals 5 may be made of either an electroless plating layer or an electroplating layer. However, the connection terminals 5 are preferably made of an electroless plating layer for the following two reasons: the first reason is to assure the freedom of design of wirings other than the electroplating wirings. More specifically, electroplating wirings need to be formed in order to form the connection terminals 5 from an electroplating layer. However, since the pitch of the connection terminals 5 is narrower than that of the external connection terminals 2 or the like (FIG. 2), forming the electroplating wirings in the mounting portion 1 will almost completely eliminate the freedom of design of wirings other than the electroplating wirings. The second reason is that, since the connection terminals 5 are sealed by the adhesive 7 in a relatively early stage of the manufacturing process of the semiconductor device, moisture can be prevented from entering the connection terminals 5 even if the connection terminals 5 does not have a dense surface layer.

The number of electroless plating layers formed between the terminal portion 2a of the external connection terminals 2 and the electrolytic gold plating layer 21 is not limited to two.

What is claimed is:
1. A semiconductor device, comprising:
   a first substrate having a first top surface, a first bottom surface opposite to the first top surface, a first external connection terminal, at least two second external connection terminals, a first wiring pattern, and a second wiring pattern; and a first semiconductor chip provided on the first top surface;

wherein the first top surface comprises a chip area in the middle of the first top surface and a peripheral area outside the chip area, and said chip area and said peripheral area do not overlap with one another, the first semiconductor chip is disposed in the chip area, the first external connection terminal is formed in the peripheral area, the at least two second external connection terminals are formed in the peripheral area outside the first external connection terminal, the first wiring pattern extends from the first external connection terminal to an outer periphery of the first top surface, the second wiring pattern extends from each of the at least two second external connection terminals to the outer periphery of the first top surface, and the first wiring pattern passes through a place between adjacent ones of the at least two second external connection terminals.

2. The semiconductor device according to claim 1, wherein multiple ones of the first external connection terminal and the at least two second external connection terminals are disposed in a grid array.

3. The semiconductor device according to claim 1, wherein the first wiring pattern is an electroplating wiring pattern.

4. The semiconductor device according to claim 3, wherein the second wiring pattern is an electroplating wiring pattern.

5. The semiconductor device according to claim 1, wherein the first wiring pattern is a Cu wiring pattern.

6. The semiconductor device according to claim 5, wherein the second wiring pattern is a Cu wiring pattern.

7. The semiconductor device according to claim 1, wherein the first wiring pattern and the second wiring pattern are covered with a solder resist.

8. The semiconductor device according to claim 1, wherein the first external connection terminal has a plurality of layers, and the plurality of the layers include an electroplating layer.

9. The semiconductor device according to claim 8, wherein the plurality of the layers further include a first electroless plating layer formed on the first wiring pattern.

10. The semiconductor device according to claim 9, wherein the plurality of the layers further include a second electroless plating layer formed on the first electroless plating layer.

11. The semiconductor device according to claim 10, wherein the electroplating layer is formed on the second electroless plating layer.

12. The semiconductor device according to claim 1, wherein a third external connection terminal is formed on the first bottom surface.

13. The semiconductor device according to claim 12, wherein at least two fourth external connection terminals are formed outside the third external connection terminal on the first bottom surface.

14. The semiconductor device according to claim 13, wherein a third wiring pattern extends from the third external connection terminal to an outer periphery of the first bottom surface, and the third wiring pattern passes through a place between adjacent ones of the at least two fourth external connection terminals.

15. The semiconductor device according to claim 1, further comprising a second substrate having a second top surface and a second bottom surface opposite to the second top surface, wherein a fifth external connection terminal is formed on the second bottom surface, and the first external connection terminal is connected to the fifth external connection terminal through a connection bump.

16. The semiconductor device according to claim 15, further comprising a second semiconductor chip provided on the second top surface.

17. The semiconductor device according to claim 1, wherein the first top surface has a plurality of external connection terminals including the first external connection terminal and the at least two second external connection terminals, the plurality of external connection terminals are disposed in the peripheral area, and the plurality of external connection terminals are disposed at substantially equal intervals.

18. The semiconductor device according to claim 1, further comprising a plurality of chip connection terminals connected to the first semiconductor chip, wherein the plurality of chip connection terminals are disposed in the chip area.

19. The semiconductor device according to claim 18, wherein a size of the first external connection terminal is larger than a size of one of the plurality of chip connection terminals.

20. The semiconductor device according to claim 18, wherein a pitch of the plurality of chip connection terminals is narrower than a pitch of the at least two second external connection terminals.

* * * * *